United States Patent [19]
Agesen et al.

[11] Patent Number: 5,909,579
[45] Date of Patent: Jun. 1, 1999

[54] METHOD AND APPARATUS FOR ENCODING AND DECODING DELTA ENCODED INFORMATION TO LOCATE LIVE POINTERS IN PROGRAM DATA STACKS

[75] Inventors: Ole Agesen, Franklin, Mass.; David Ungar, Palo Alto, Calif.

[73] Assignee: Sun Microsystems, Inc., Palo Alto, Calif.

[21] Appl. No.: 08/847,770

[22] Filed: Apr. 23, 1997

[51] Int. Cl.⁶ .................................................. G06B 9/44
[52] U.S. Cl. ......................... 395/704; 395/376; 707/206
[58] Field of Search .................................. 395/702, 704, 395/706, 710, 376, 378, 379; 707/205, 206

[56] References Cited

U.S. PATENT DOCUMENTS

| | | | |
|---|---|---|---|
| 4,757,438 | 7/1988 | Thatte et al. | 711/6 |
| 4,907,151 | 3/1990 | Bartlett | 711/166 |
| 4,920,483 | 4/1990 | Pogue et al. | 711/219 |
| 5,088,036 | 2/1992 | Ellis et al. | 707/206 |
| 5,222,221 | 6/1993 | Houri et al. | 395/676 |
| 5,301,288 | 4/1994 | Newman et al. | 711/202 |
| 5,355,483 | 10/1994 | Serlet | 711/154 |
| 5,408,650 | 4/1995 | Arsenault | 395/704 |
| 5,535,329 | 7/1996 | Hastings | 395/183.11 |
| 5,560,003 | 9/1996 | Nilsen et al. | 707/206 |
| 5,561,786 | 10/1996 | Morse | 711/170 |
| 5,566,321 | 10/1996 | Pase et al. | 711/153 |
| 5,590,332 | 12/1996 | Baker | 395/705 |
| 5,687,368 | 11/1997 | Nilsen | 707/103 |

OTHER PUBLICATIONS

*If Memory Serves,* Hand On Some Assembly Required, by Rick Grehen, Aug. 1989, pp. 279, 280, 282, 284 and 286.

*Virtually Virtual Memory,* Hands On Some Assembly Required, by Rick Grehan, Sep. 1990, pp. 455, 456, 458, 460, 462 and 464.

*Evaluation of Parallel Copying Garbage Collection on a Shared–Memory Multiprocessor,* by Akira Imai et al., IEEE Transactions on Parallel and Distributed Systems, vol. 4, No. 9, Sep. 1993, pp. 1030–1040.

*On Multi–Threaded List–Processing and Garbage Collection,* by Wolfgang W. Kuechlin et al., Department of Computer and Information Science, The Ohio State University, Jan. 1991, pp. 894–897.

*HeapGuard™, Eliminating Garbage Collection in Real–Time Ada Systems,* Sam Harbaugh et al., Integrated Software, Inc., pp. 704–708.

*Windows,* Windows' Invisible Wall: The 64K Barrier, by Ed Bott, Mar. 1994, pp. 210–212.

(List continued on next page.)

*Primary Examiner*—Parshotam S. Lall
*Assistant Examiner*—Viet Vu
*Attorney, Agent, or Firm*—Kudirka & Jobse, LLP

[57] ABSTRACT

Live pointer information for a stream of bytecodes is precomputed for each bytecode. The precomputed full live pointer information is stored only for bytecodes at predetermined intervals in the stream. Between the bytecodes for which full live pointer information is stored, changes in the live pointer information produced by each bytecode are encoded using a suitable compressive coding and stored. Later, when a program which needs the live pointer information, such as garbage collection, is initiated, the full live pointer information for the nearest bytecode preceding the desired bytecode boundary is retrieved along with the intervening coded changes. The changes are decoded and applied to the retrieved live pointer information to generate the live pointer information at the desired bytecode boundary. In one embodiment of the invention, the live pointer changes are delta encoded so that each code contains information relating to the live pointer changes produced by a bytecode from the live pointer information as modified by the previous delta code. In another embodiment of the invention, the delta coded changes are encoded with a Huffman encoding scheme.

42 Claims, 7 Drawing Sheets

OTHER PUBLICATIONS

*Garbage Collection for Prolog Based on WaM,* Communications of the ACM, vol. 31, issue 6, by Karen et al., Dec. 4, 1996, pp. 1–20.

David Vinayak Wallace & Michael Tiemann, *Simple Garbage Collection in G++,* Cygnus Support, Revision 1.1, cov. and pp. 1–4.

Alejandro Caro, *A Novel 64 Bit Data Representation for Garbage Collection and Synchronizing Memory, Computation Structures Group Memo 396,* Apr. 9, 1997, Laboratory for Computer Science—MIT, cov. and pp. 1–4.

Robert Courts, *Improving Locality of Reference in a Garbage–Collecting Memory Management System,* Research Contributions, Artificial Intelligence and Language Processing, *Communication of the ACM,* Sep. 1988, vol. 31, No. 9, pp. 1128–1138.

David A. Moon, *Garbage Collection in a Large Lisp System,* 1984 ACM 0–89791–142–3/84/008/0235, pp. 235–246.

David A. Barrett, *Improving the Performance of Conservative Generational Garbage Collection,* Sep. 1995, University of Colorado at Boulder Technical Report CU–CS–784–95.

*Dynamic Storage Allocation: A Survey and Critical Review,* by Paul R. Wilson et al., date unknown, pp. 1–78.

*Compliers, Principles, Techniques, and Tools,* by Alfred V. Aho et al., 1985, pp. i–x, chapter 10, pp. 585–607.

*Garbage Collection, Algorithms for Automatic Dynamic Memory Management,* by Richard Jones et al., 1996.

*Object Oriented Design with Applications,* by Grady Booch, 1991.

*A Fast Write Barrier for Generational Garbage Collectors,* by Urs Holzle et al., Oct. 1993, pp. 1–6.

*GC–FAQ—draft,* http://www./centerline.com/people/chase/GC/GC–faq.html, 29 pages, Jan. 6, 1997.

*An Introduction to the Win32 API,* by Richard Hale Shaw, PC Magazine, vol. 13, No. 8, pp. 291–295, Apr. 26, 1994.

METHOD AND APPARATUS FOR ENCODING AND DECODING DELTA ENCODED INFORMATION TO LOCATE LIVE POINTERS IN PROGRAM DATA STACKS

FIELD OF THE INVENTION

The present invention relates to data processing systems, and, more specifically, to apparatus and methods for assisting with memory management.

BACKGROUND OF THE INVENTION

One of the most important resources within a data processing system is the amount of memory directly available for utilization by tasks during execution. Accordingly, much interest has been directed to efficient utilization of memory and memory management strategies. An important concept in memory management is the manner in which memory is allocated to a task, deallocated and then reclaimed.

Memory deallocation and reclamation may be explicit and controlled by an executing program, or may be carried out by another special purpose program which locates and reclaims memory which is unused, but has not been explicitly deallocated. "Garbage collection" is the term used in technical literature and the relevant arts to refer to a class of algorithms utilized to carry out storage management, specifically automatic memory reclamation. There are many known garbage collection algorithms, including reference counting, mark-sweep, and generational garbage collection algorithms. These, and other garbage collection techniques, are described in detail in a book entitled "Garbage Collection, Algorithms For Automatic Dynamic Memory Management" by Richard Jones and Raphael Lins, John Wiley & Sons, 1996. Unfortunately, many of the described techniques for garbage collection have specific requirements which cause implementation problems, as described herein.

A data structure may be located by a "reference", or a small amount of information that can be used to access the data structure. One way to implement a reference is by means of a "pointer" or "machine address", which uses multiple bits of information, however, other implementations are possible. General-purpose programming languages and other programmed systems often use references to locate and access data structures. Such structures can themselves contain references to data, such as integers or floating-point numbers and to yet other structures. In this manner, a chain of references can be created, each reference pointing to a structure which, in turn, points to another structure.

Garbage collection techniques determine when a data structure is no longer reachable by an executing program, either directly or through a chain of pointers. When a data structure is no longer reachable, the memory that the data structure occupies can be reclaimed and reused even if it has not been explicitly deallocated by the program. To be effective, garbage collection techniques should be able to, first, identify references that are directly accessible to the executing program, and, second, given a reference to a data structure, identify references contained within that structure, thereby allowing the garbage collector to trace transitively chains of references.

A subclass of garbage collectors known as "relocating" garbage collectors, relocate data structures that are still reachable by the executing program. Relocation of a data structure is accomplished by making a copy of the data structure in another region of memory, then replacing all reachable references to the original data structure with references to the new copy. The memory occupied by the original data structure may then be reclaimed and reused. Relocating garbage collectors have the desirable property that they compact the memory used by the executing program and thereby reduce memory fragmentation.

Because relocating garbage collectors modify references during the garbage collection process, it is important that references be identified and distinguished from non-reference information, such as data, which cannot be modified for garbage collection purposes. Consequently, fully relocating garbage collectors belong to a subclass of garbage collection methods, known as "exact" garbage collectors, which require knowledge of the location of references or "live" pointers so that these can be modified or followed during the garbage collection process.

In order to positively identify references, some computing systems use a "tagged" representation for all memory locations. In such systems, references and primitive data, such as integers and floating-point numbers, are represented in memory in a manner that a reference always has a different bit pattern than a primitive value. This is generally done by including tag bits in each memory location in addition to the bits holding the memory location value. The tag bits for a memory location holding a reference value are always different from the tag bits for a memory location holding a datum value.

Other computer systems use an "untagged" data representation in which the entire memory word is devoted to representing the datum value. In such systems, the same bit pattern might represent a reference or a primitive value. In such systems, the distinction between references and primitive values can sometimes be made from external considerations or representations, such as the instruction that is to operate on the data, or the position of the data within an object. However, the use of external considerations to make this distinction was not possible in all systems.

For example, the Java programming language was originally designed for use in systems using untagged data representation. The Java programming language is described in detail in the text entitled "The Java Language Specification" by James Gosling, Bill Joy and Guy Steele, Addison-Wesley, 1996. The Java language was designed to run on computing systems with characteristics that are specified by the Java Virtual Machine Specification which is described in detail in a text entitled "The Java Virtual Machine Specification", by Tim Lindholm and Frank Yellin, Addison-Wesley, 1996.

According to the Java Virtual Machine (JVM) Specification, a local variable or stack slot in a computing system using 32-bit memory words may contain either a 32-bit integer, a 32-bit floating-point number, or a 32-bit reference. Consequently, tagged data representation cannot be used in all cases (programming languages that use tagged data representation on 32-bit computer architectures typically restrict the size of integers to 30 bits.) Further, in many cases, it is not possible to distinguish references from data by examining the Java instructions, because many instructions operate indiscriminately on references and data. Therefore other methods must be used to locate the live pointer information on the program stack.

To further complicate the process of locating live pointer information, many garbage collection algorithms, such as mark-sweep, relocating and generational collectors operate by halting operation of the ongoing computation, running a specialized garbage collection program and then resuming the ongoing computation. With these collectors, it is necessary to obtain the live pointer information on the program stack at the program code boundary at which the ongoing computation is stopped to perform garbage collection. In the following discussion the term "bytecode" will be used to describe a program code word. This corresponds to the case where program code operands are one byte long, however, the invention applies to systems where the program codes have other lengths as well and the term "bytecode" is not intended to be limiting. In a JVM, the ongoing computation may be stopped at many bytecode boundaries so that the problem of determining the live pointer information is complex.

Since the change in the live pointer information on the stack frame due to the operation of a particular bytecode can be calculated in many instances, one method of obtaining the live pointer information when garbage collection is needed is to start with the stack configuration at the beginning of a method and calculate, bytecode by bytecode, the change in the live pointer information for each method until the bytecode boundary at which garbage collection is to take place is reached. However, at best, such an approach is time-consuming and will lead to a large time delay at the beginning of garbage collection. In some cases, such a calculation may not be possible after the bytecode has been executed or because bytecode substitutions have been made. For example, the Java language substitutes "quick" bytecodes for some instructions under certain circumstances and it may not be possible to compute the live pointer changes with some quick bytecodes.

Another method for generating the required live pointer information is to precompute the live pointer information for each possible bytecode in a program in advance of program operation and store a map or "mask" indicating the location of the live pointers on the program stack for each bytecode. This mask computation might be performed during compilation or program load before the program is actually executed. Then, when garbage collection is initiated, the stored mask information corresponding to the selected bytecode boundary can be retrieved and used to determine the location of live pointers.

The aforementioned technique eliminates the delay required to compute the live pointer information on demand, but requires a large space overhead. For example, the live pointer information can be represented as a bit vector with one bit for each stack item. Using this representation, as a test, the live pointer information was precomputed for a sample program run. During this run 206,034 program bytecodes were loaded and 693,288 bits were required to store the precomputed live pointer masks (the latter figure does not include data structures which would be necessary to store and retrieve the bits). In many contexts, such a space overhead would be prohibitive.

Accordingly, there is a need for a technique to locate live pointers in the active stack frame on computer systems which do not accommodate tagged data representations without requiring an on demand computation of the live pointer information and without requiring live pointer information to be stored for all bytecodes.

SUMMARY OF THE INVENTION

In accordance with the principles of the invention, live pointer information for a stream of bytecodes is precomputed for each bytecode. The precomputed full live pointer information is stored only for bytecodes at predetermined intervals in the stream. Between the bytecodes for which full live pointer information is stored, changes in the live pointer information produced by each bytecode are encoded using a suitable compressive coding and stored. Later, when garbage collection is initiated, the full live pointer information for the nearest bytecode preceding the desired bytecode boundary is retrieved along with the intervening coded changes. The changes are decoded and applied to the retrieved live pointer information to generate the live pointer information at the desired bytecode boundary.

In accordance with one embodiment of the invention, the live pointer changes are delta encoded so that each code contains information relating to the live pointer changes produced by a bytecode from the live pointer information as modified by the previous delta code.

In accordance with another embodiment of the invention, the delta coded changes are encoded with a Huffman encoding scheme.

The stored information can be decoded by retrieving the full live pointer information stored for the bytecode immediately previous to the desired bytecode boundary and then successively retrieving, decoding and applying the changes for each bytecode between the bytecode for which the full pointer information was stored and the desired bytecode boundary.

In accordance with still another embodiment of the invention, a hybrid arrangement can be used in which methods that have large frames (for example, with many local variables or deep operand stacks) are delta encoded as described above and the remainder of the bytecodes have full live pointer information stored for each bytecode.

BRIEF DESCRIPTION OF THE DRAWINGS

The above and other features, objects and advantages of the invention will be better understood by referring to the following description in conjunction with the accompanying drawing in which.

DESCRIPTION OF THE PREFERRED EMBODIMENT

The present invention provides a method and apparatus which addresses the requirements of exact garbage collection algorithms. Specifically, the invention addresses the requirement of locating active references or live pointers within a data stack where untagged data representations are nominally used with a computer architecture whose structure encourages the use of data representation such that references and primitive values are the same size.

Although the illustrative embodiments are described with reference to a computer system implementing the Java programming language and Java Virtual Machine specifications, the invention is equally applicable to other computer systems having similar requirements. Specifically, the invention may be implemented with both object oriented and non-object oriented programming systems. Further, the invention may be implemented with systems having single threads and single program stacks as well as with multi threaded systems, having multiple simultaneous program stacks. Prior to describing the invention in detail, descriptions of a computer system suitable for use with the present invention and a program stack structure are provided for the reader's benefit.

Computer System and Program Stack Architecture

Figure 1A:
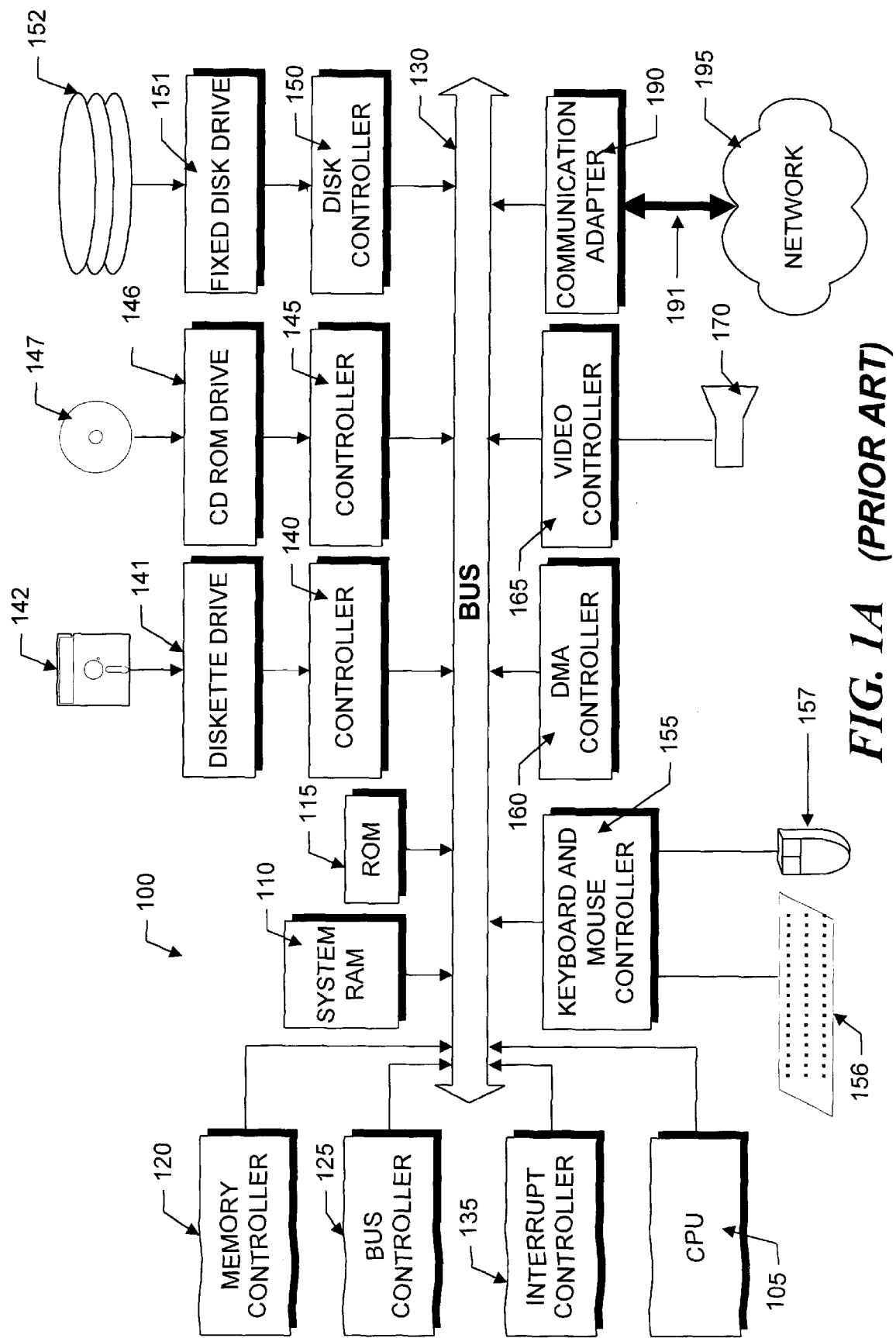
FIG. 1A is a schematic block diagram illustrating a computer architecture suitable for use with the present invention.

FIG. 1A illustrates the system architecture for a computer system with which the invention may be implemented. The exemplary computer system of FIG. 1 is for descriptive purposes only. Although the description may refer to terms commonly used in describing particular computer systems, such as in IBM PS/2 personal computer, the description and concepts equally apply to other computer systems such as network computers, workstation and even mainframe computers having architectures dissimilar to FIG. 1A.

Computer system 100 includes a central processing unit (CPU) 105, which may be implemented with a conventional microprocessor, a random access memory (RAM) 110 for temporary storage of information, and a read only memory (ROM) 115 for permanent storage of information. A memory controller 120 is provided for controlling RAM 110.

A bus 130 interconnects the components of computer system 100. A bus controller 125 is provided for controlling bus 130. An interrupt controller 135 is used for receiving and processing various interrupt signals from the system components.

Mass storage may be provided by diskette 142, CD ROM 147, or hard drive 152. Data and software may be exchanged with computer system 100 via removable media such as diskette 142 and CD ROM 147. Diskette 142 is insertable into diskette drive 141 which is, in turn, connected to bus 30 by a controller 140. Similarly, CD ROM 147 is insertable into CD ROM drive 146 which is, in turn, connected to bus 130 by controller 145. Hard disk 152 is part of a fixed disk drive 151 which is connected to bus 130 by controller 150.

User input to computer system 100 may be provided by a number of devices. For example, a keyboard 156 and mouse 157 are connected to bus 130 by controller 155. An audio transducer 196, which may act as both a microphone and a speaker, is connected to bus 130 by audio controller 197, as illustrated. It will be obvious to those reasonably skilled in the art that other input devices, such as a pen and/or tabloid may be connected to bus 130 and an appropriate controller and software, as required. DMA controller 160 is provided for performing direct memory access to RAM 110. A visual display is generated by video controller 165 which controls video display 170. Computer system 100 also includes a communications adaptor 190 which allows the system to be interconnected to a local area network (LAN) or a wide area network (WAN), schematically illustrated by bus 191 and network 195.

Operation of computer system 100 is generally controlled and coordinated by operating system software, which may be single or multiple threaded. The operating system controls allocation of system resources and performs tasks such as processing scheduling, memory management, networking, and I/O services, among things.

In conventional computing systems, an ongoing computation uses a program "stack", or "data stack", to support procedure calls and to hold intermediate computational quantities such as references, and primitive values. A stack comprises an unused portion of internal memory which reduces the number of registers needed for temporary storage and decreases the number of steps needed in a program, while facilitating push-down type storage. FIG. 1B illustrates conceptually the structure of a conventional program stack implemented in system memory. Three important positions in memory define the stack: the stack base, the stack pointer, i.e., the current stack top, and the stack limit. Typically, these positions are identified by memory addresses kept in three machine registers.

When a datum is to be pushed onto the stack, it is stored into the unused memory location nearest the stack pointer. The stack pointer is then advanced toward the stack limit. If the stack pointer is too close to the stack limit, the stack is said to "overflow" and some special action must be taken, e.g. signal an error or allocate more memory to hold the stack.

When a datum is to be popped from the stack, the stack pointer recedes toward the stack base, causing the memory that holds the datum to become regarded as unused memory again. If the stack pointer is too close to the stack base, the stack is said to "underflow" and some special action must be taken, e.g. signal an error or switch to another region of memory that holds more stack data. Depending on the implementation, the stack base may reside at either a higher or lower memory address than the stack limit.

Figure 1C:
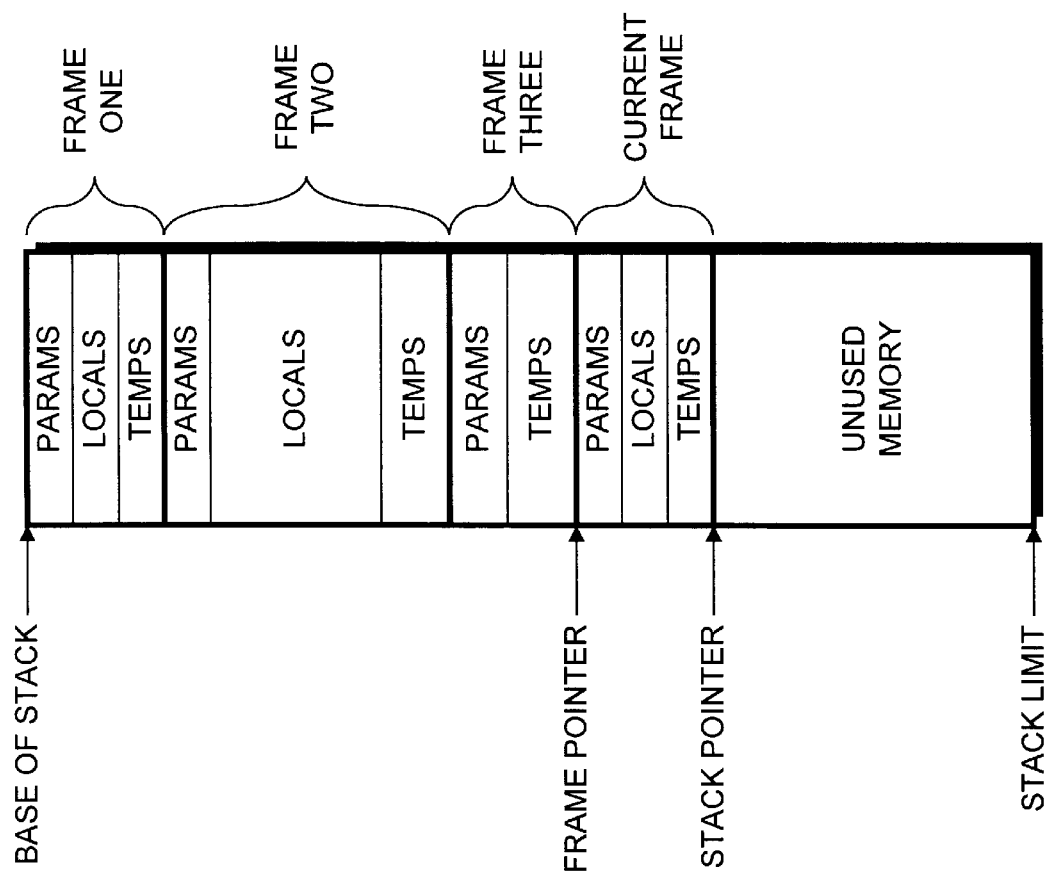
FIG. 1C is a conceptual illustration of a program stack arranged with frames.
Figure 1B:
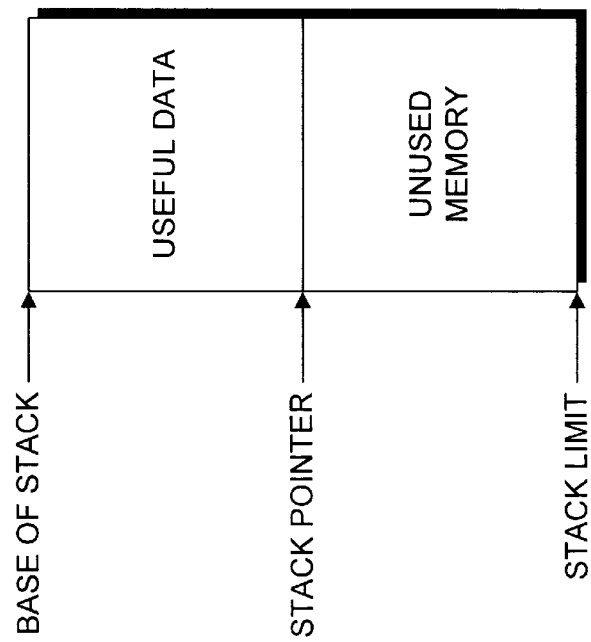
FIG. 1B is a conceptual illustration of a conventional program data stack.

In the Java programming language, data on the stack is grouped into "frames", as illustrated in FIG. 1C. Each frame corresponds to one level of subroutine invocation or method invocation. Every frame is divided into three regions: parameters, local variables, and evaluation temporaries. Parameters are closest to the stack base while the evaluation temporaries are furthest from the stack base. Each of these three regions may be empty, depending on the particular subroutine to be executed with that frame. As a subroutine executes, the number of evaluation temporaries may vary as items are pushed onto or popped from the stack, however, the number of parameters and local variables typically does not vary. Consequently, different frames may have different sizes.

To simplify addressing of parameters and local variables, an additional address, the "frame pointer", typically kept in a machine register, indicates start of the parameter area in the active stack frame. Instructions can then access a parameter or local variable in the active frame by specifying an offset from the active frame pointer.

When a subroutine or method is to be invoked, some items at the top of the evaluation stack become parameters within the new frame. The active frame pointer is saved on the stack along with the program counter. The frame pointer is then loaded with the address of the new frame while the program counter is loaded with the address of the code for the subroutine.

Figure 1D:
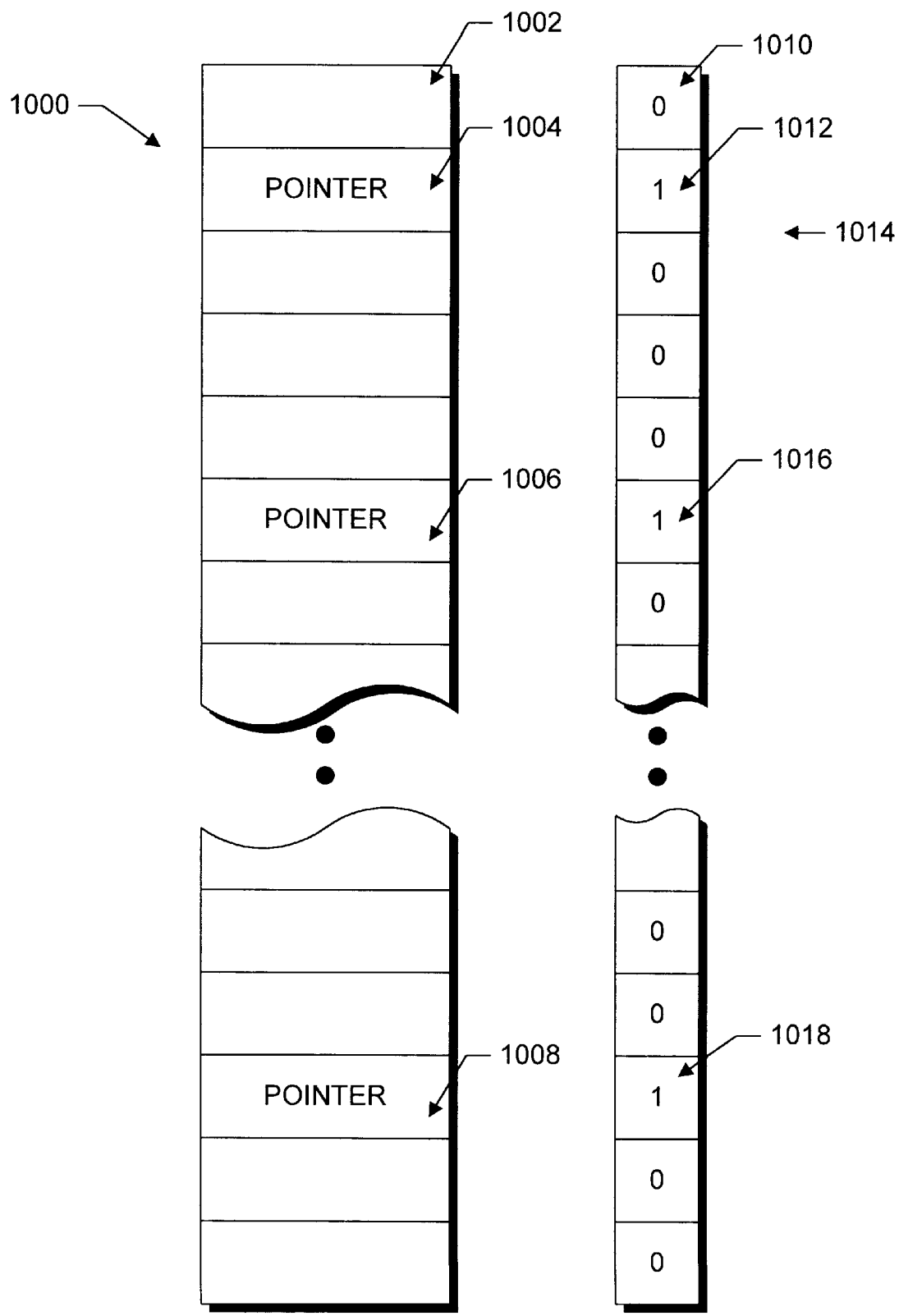
FIG. 1D is a conceptual illustration of a program stack with the live pointer locations represented by a bit vector.

A typical technique by which live pointers are designated on a program stack is shown in FIG. 1D, which illustrates a logical stack 1000 and an accompanying bit vector 1014.

While stack 1000 is conceptually shown as a block of contiguous memory locations, an actual stack may be comprised of several non-contiguous blocks of memory. However, for discussion purposes, the stack acts logically as a single contiguous block of memory. Each memory location, for example memory location 1002, can hold a variety of information, including different data types and references or pointers. As previously mentioned, the location of the live references are important to programs such as the garbage collection programs, which must either modify or follow the references.

FIG. 1D memory locations, designated as 1004, 1006, and 1008, illustratively contain live reference or pointer information. The location of the live pointers in the stack is mapped by the bit vector 1014, which contains a bit for each location in the stack. For example, bit 1010 corresponds to location 1002 and bit 1012 corresponds to location 1004. As shown in FIG. 1D, the bits in the bit vector have been set in locations corresponding to the pointer locations, thus bit vector 1014 has bit locations 1012, 1016, and 1018 set in order to indicate that the corresponding stack location contains a live pointer. Programs which need to access the live pointers can then examine the bit vector to determine which corresponding stack locations contain live pointers even though the actual data in the stack locations does not positively identify pointers.

As previously mentioned, it is possible to construct a bit vector which indicates the locations of the live pointers in the program stack for each bytecode in a program stream. If this bit vector is then stored, it is a relatively simple matter to retrieve the bit vector and determine the location of live pointers at any given bytecode boundary. However, the storage requirements for all of the pre-computed bit vectors is substantial, and in many cases prohibitive.

Figure 2:
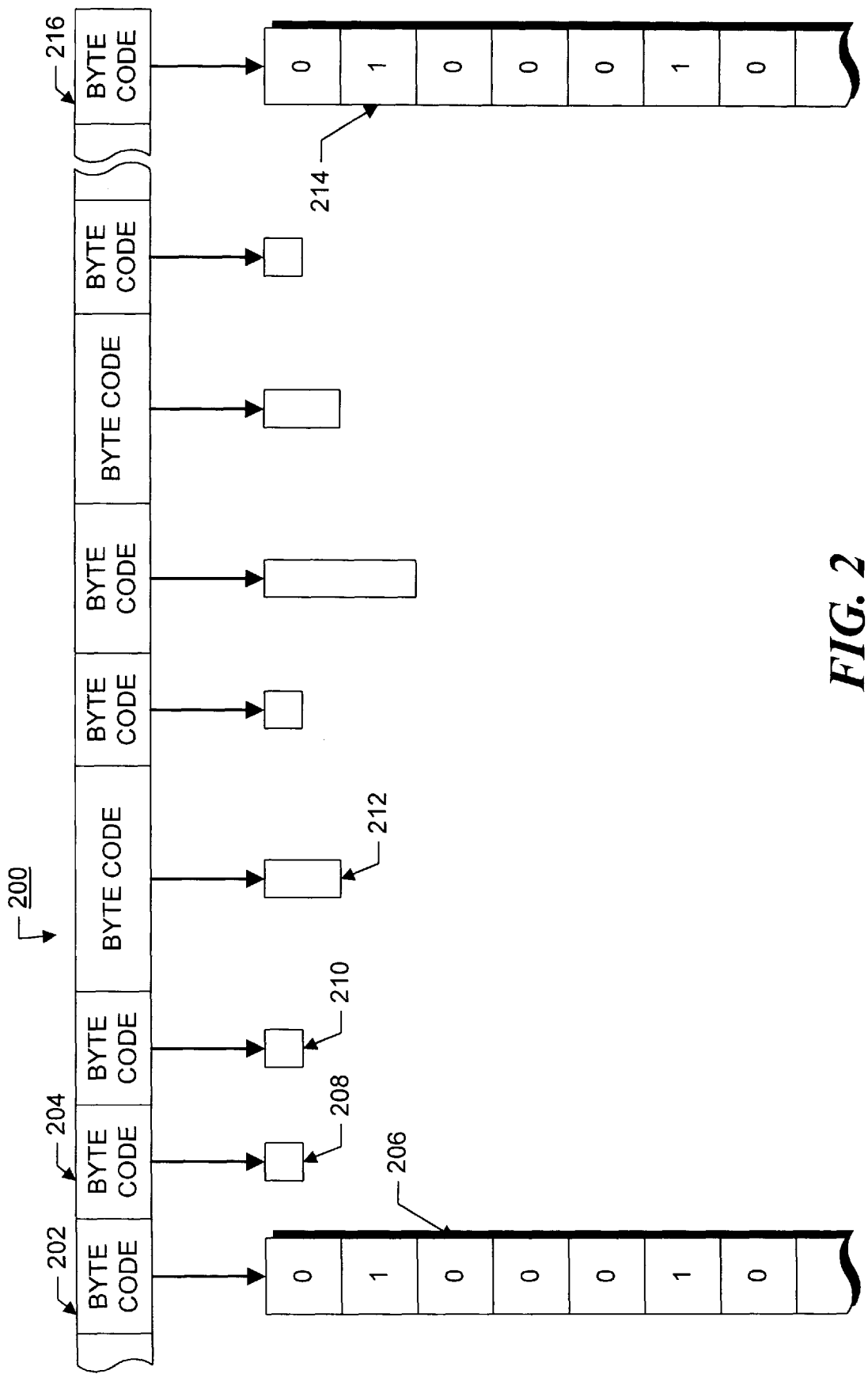
FIG. 2 is an illustration showing a stream of bytecodes with full live pointer information stored for bytecodes located at predetermined intervals in the stream and delta coded information stored for bytecodes between the predetermined intervals.

In accordance with the principles of the invention, the live pointer information for each bytecode is stored in a compressed form, which allows rapid reconstruction of a bit vector that maps the locations of the live pointers in the stack frame at a particular bytecode boundary. This storage process is illustrated in FIG. 2 which illustrates a portion of a bytecode stream 200, which corresponds to the individual bytecodes, for example bytecodes 200 and 204 of a method. The bytecodes are illustrated as having different lengths because, although each operand has an illustrative length of one byte, each instruction may have one or more arguments which follow the operand.

At a time prior to the execution of the method, for example during program compilation or loading, each bytecode and its accompanying arguments are examined by a stack analyzer mechanism to determine their affect on the locations of the live pointers in a stack frame corresponding to the selected method, and a bit vector is constructed for that stack frame. The bit vector contains a bit which corresponds to each stack frame item and is computed at bytecode boundaries (the term "boundary" means that the bit vector is computed including the effect on pointer locations of the bytecodes up to, and including, the bytecode immediately preceding the boundary.) Generally, the bit vectors are computed for each stack frame and then concatenated to produce the entire bit vector. The values of the bits in the bit vector indicate the locations of the live pointers on the stack frame. For example, each pointer location may have the corresponding bit set to a binary "1" whereas non-pointer locations may be set to binary "0"s. The construction of this bit vector might be done, for example, in a JVM during program load by a stack analyzer mechanism similar to the JVM verifier mechanism. A stack analyzer mechanism suitable for use with the invention is described in the aforementioned Gosling text.

However, instead of storing a bit vector for the entire stack frame for each bytecode in a method, an interval is predetermined (for example an interval of 16 bytecodes), and for every sixteenth bytecode, the bit vector corresponding to the full live pointer information on a program stack frame is stored. Illustratively, bit vector 206 is stored for bytecode 202, and bit vector 214 is stored for bytecode 216. Alternatively, live pointer information can be stored at different intervals within the method. For example, pointer information can be stored at 16-bytecode intervals in part of the program and at other intervals in other portions of the program. In addition, at program instructions which cause a "jump", the pointer locations may change radically. Consequently, the full live pointer information can be stored at bytecode boundaries appropriate to these instructions. In still other portions of the program, the entire live pointer bit mask may be stored for each bytecode.

However, between bytecodes for which a full bit vector is stored, each bytecode is examined by a bytecode analyzer mechanism to determine the changes which the bytecode makes to the live pointer locations in the program stack frame. For example, a particular bytecode may push a live pointer on the stack or pop a live pointer off the stack. The change produced by the bytecode is then preferably encoded, using a suitable compression coding. In particular, the encoded change produced by the bytecode is a "delta" change, that is, it is the change to the program stack frame live pointer locations as modified by the previous bytecode.

A number of different coding schemes can be used to encode the changes produced by each bytecode. Preferably, a compressive encoding scheme can be used. An encoding method which is particularly useful for the present invention, is a conventional Huffman encoding scheme. Such a scheme is described in detail in an article entitled "*A Method for the Construction of Minimum Redundancy Codes*", D. Huffman, Proceedings of the IRE, v. 40, pp. 1098–1101 (1952) which article is hereby incorporated by reference.

In order to use a Huffman encoding scheme, the relative frequencies of changes produced by bytecodes are determined before the actual processing of bytecodes begins. The relative frequencies can be determined before actual processing, for example, by examining several sample programs and noting the changes produced by each bytecode. The changes are then sorted in order of decreasing frequency. Huffman codes are assigned to each of the changes in a conventional, well-known manner. For example, if the most frequent change in the live pointer location set caused by a bytecode is no change, then the code "0" might be assigned to that change. If the next most frequent change is that a live pointer is pushed onto the stack, then that change might be encoded as "10". Once codes are assigned, the "on-line" processing of bytecodes can be performed.

This "on-line" coding is shown schematically in FIG. 2. For example, the changes produced by bytecode 204 might be encoded with a single bit 208. Similarly, the changes produced by the succeeding bytecodes might be encoded by bits 210 and 212. Because of the nature of the Huffman encoding scheme, the bit codes necessary to encode the changes vary in length. However, since there is a limited set of bytecodes and changes produced by those bytecodes, the number of Huffman codes which would be required to encode all possible changes is a small set. Consequently, the number of bits required for the coding is also small.

Figure 3:
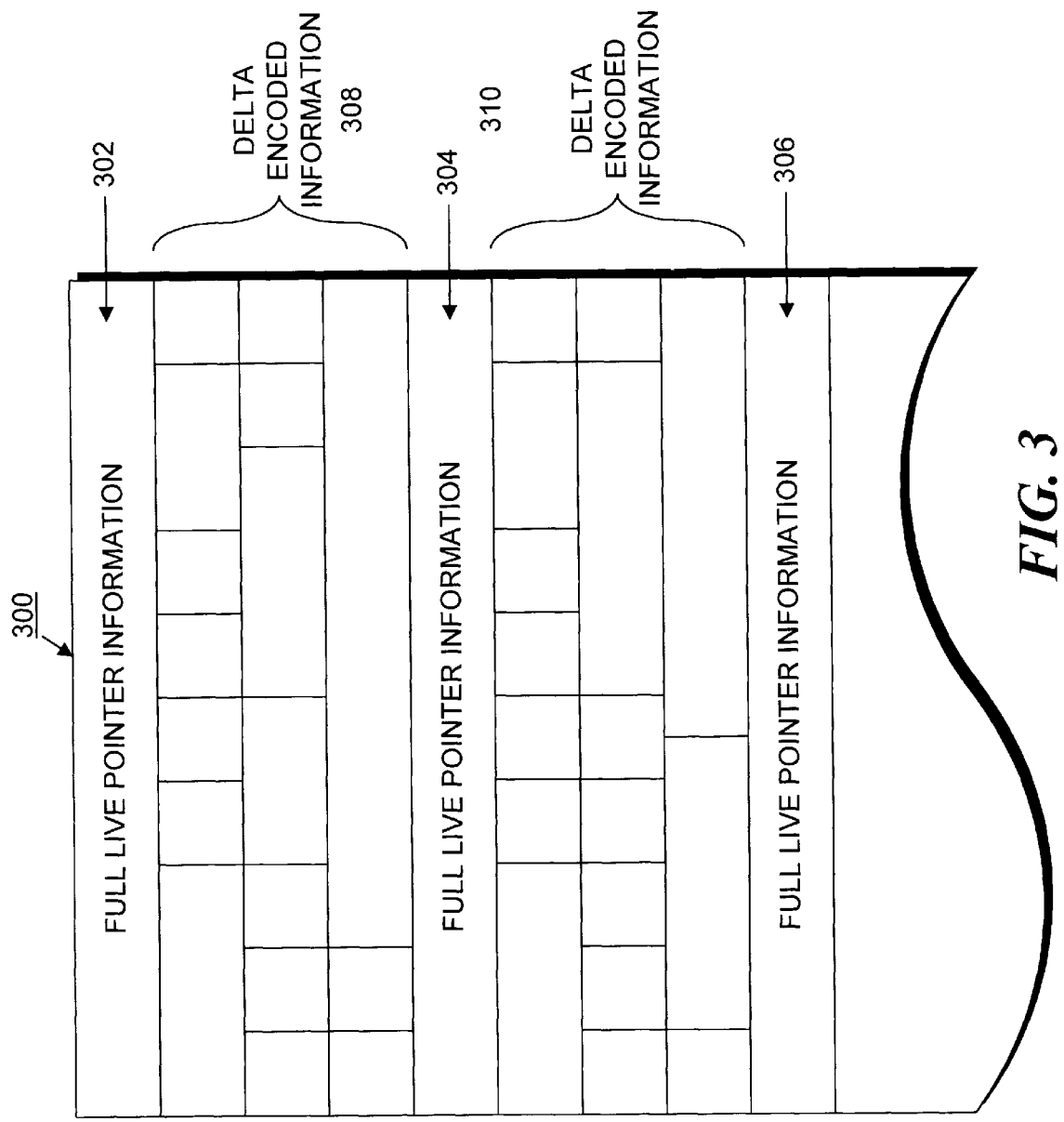
FIG. 3 is an illustrative section of memory illustrating the storage of full and coded live pointer information

The resulting coded information might be stored as shown in FIG. 3. FIG. 3 illustrates in a conceptual schematic form, a section of memory 300. Memory 300 is arranged so that bit vectors representing the full live pointer information are periodically stored, as represented by areas 302, 304, and 306. Between these areas, the delta-coded information for the changes produced by the 15 bytecodes between the bytecodes for which live pointer information is stored are also stored as Huffman-encoded values, as indicated by areas 308 and 310.

Figure 4:
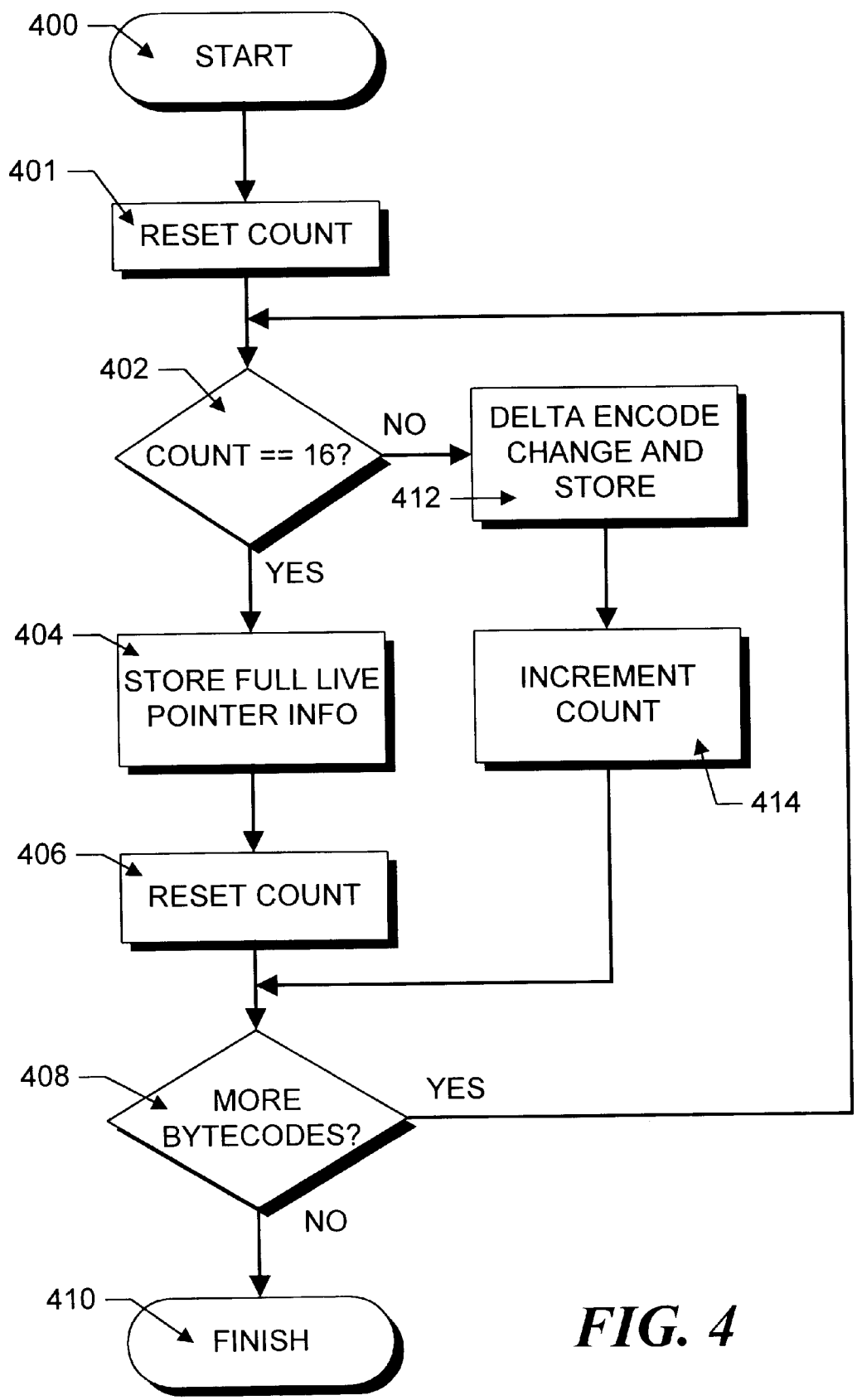
FIG. 4 is a flow chart illustrating the steps of a method in accordance with one aspect of the present invention in which the live pointer information is encoded.

The routine by which the aforementioned encoding is performed for each bytecode in a method is illustrated in the flowchart shown in FIG. 4. This routine starts in step 400, and proceeds to step 401 where a counter is reset to zero. In step 402, the counter is checked to see whether it has reached a predetermined count, corresponding to a bytecode interval at which full live pointer information is to be stored, for example, sixteen bytecodes. Of course, other bytecode intervals might be used, depending on the particular circumstances. If the counter interval has reached the predetermined count, in step 404 the full live pointer information is stored, preferably as a bit vector and the count is reset in step 406.

In step 408 a check is made to determine if any more bytecodes remain in the method under consideration. If not, operation then terminates in step 410. If more bytecodes remain, the routine proceeds back to step 402 to process the next bytecode.

Alternatively, if, in step 402, the count has not reached the predetermined count, then the change in the live pointer information produced by the bytecode under examination is encoded and stored in step 412. The counter is incremented in step 414 and the routine proceeds to step 408 to determine whether any more bytecodes remain in the method and operation proceeds as described above.

Figure 5:
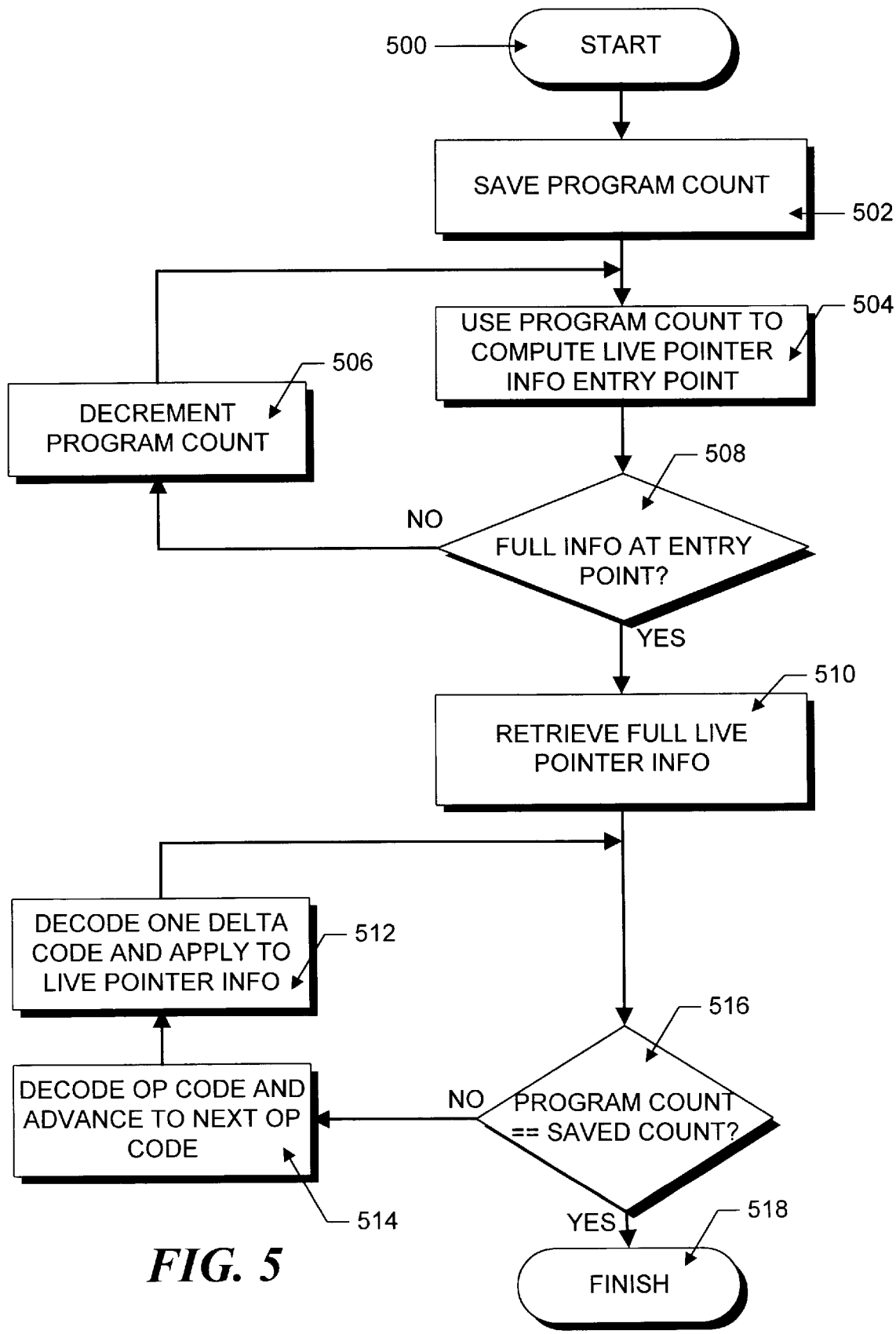
FIG. 5 is a flow chart illustrating the steps of a method in accordance with one aspect of the present invention in which the live pointer information is decoded.

Decoding of the stored information to obtain a bit vector indicating the live pointer location at a particular bytecode boundary is also straightforward. A flowchart which embodies an illustrative method for decoding is shown in FIG. 5. In particular, this routine starts in step 500, and proceeds to step 502 where the program counter count is saved for later comparison during the decoding process. In step 504, the program counter count is used to compute an entry into the memory locations where the live pointer information is stored. For example, the program count could be added to an offset, which indicates the base location of the memory where the live pointer information is stored. Other mechanisms might also be used to locate the live pointer information. The live pointer information at the entry point is examined in step 508 to determine if it is the start of a bit vector representing the full live pointer information for a bytecode preceding the desired bytecode boundary. If the entry point is the start of the full live pointer information, then the full live pointer information is retrieved in step 510.

Alternatively, if, in step 508, the entry point is not the start of the full live pointer information for a preceding bytecode, then, in step 506, the program counter is decremented. The routine then returns to step 504 to determine a new entry point into the live pointer information from the new program count. In step 508, the routine determines whether the live pointer information at the new entry point is the start of a bit vector representing the full live pointer information. Operation continues in this manner until the start of the full live pointer information is reached and retrieved in step 510. The routine then proceeds to step 516.

At this point the program counter is at a bytecode boundary for which the full live pointer information was retrieved. It is now necessary to determine how many bytecodes exist between the present program count and the desired location as indicated by the count saved in step 502. Accordingly, a check is then made in step 516 to determine whether the present program is equal to the saved count. If not, the bytecode or opcode is decoded and the number or operands or arguments is determined. The program counter is then advanced to the next opcode. An additional delta code is retrieved from the live pointer information memory locations and decoded in step 512.

The decoding of Huffman-encoded data is well-known and involves the creation and traversal of a Huffman decoding tree. The decoded change is then applied to the live pointer information retrieved in step 512. The routine then returns to step 516.

Coded changes are then retrieved, decoded, and applied to the live pointer information until the desired bytecode boundary is reached, indicated by the present program count equalling the saved program count in step 516. The routine then finishes in step 518. At this point, the live pointer information is available indicating the location of all live pointers in the stack. This live pointer information may then subsequently be used in other operations, such as garbage collection.

In accordance with another embodiment of the invention, a hybrid arrangement can be used. In this alternative embodiment, methods that have large frames (for example, with many local variables or deep operand stacks) are delta encoded as described above and the remainder of the bytecodes have full live pointer information stored for each bytecode.

In yet another alternate embodiment, the invention may be implemented as a computer program product for use with a computer system. Such implementation may comprise a series of computer instructions either fixed on a tangible medium, such as a computer readable media, e.g. diskette 142, CD-ROM 147, ROM 115, or fixed disk 152 of FIG. 1A, or transmittable to a computer system, via a modem or other interface device, such as communications adapter 190 connected to the network 195 over a medium 191. Medium 191 can be either a tangible medium, including but not limited to optical or analog communications lines, or may be implemented with wireless techniques, including but not limited to microwave, infrared or other transmission techniques. The series of computer instructions embodies all or part of the functionality previously described herein with respect to the invention. Those skilled in the art will appreciate that such computer instructions can be written in a number of programming languages for use with many computer architectures or operating systems. Further, such instructions may be stored using any memory technology, present or future, including, but not limited to, semiconductor, magnetic, optical or other memory devices, or transmitted using any communications technology, present or future, including but not limited to optical, infrared, microwave, or other transmission technologies. It is contemplated that such a computer program product may be distributed as a removable media with accompanying printed or electronic documentation, e.g., shrink wrapped software, preloaded with a computer system, e.g., on system ROM or fixed disk, or distributed from a server or electronic bulletin board over a network, e.g., the Internet or World Wide Web.

Although various exemplary embodiments of the invention have been disclosed, it will be apparent to those skilled in the art that various changes and modifications can be made which will achieve some of the advantages of the invention without departing from the spirit and scope of the invention. For example, although Huffman-encoding has been described, other compressive encoding methods can be used. Alternatively, instead of "backing up" the program counter to locate the beginning of the full live pointer information, an external bit map could be used with bit locations corresponding to each bytecode. The bits in this bit map could then be set in locations where full live pointer information is stored. This latter arrangement provides a relatively fast method for locating the full live pointer information, but requires considerable overhead. Still another alternative is to modify the routine in FIG. 4 in order to store a code in the live pointer information area for each byte in a stack frame whether the byte represented a bytecode or arguments used by the bytecode. In the case of bytes which correspond to a bytecode, the delta codes discussed above are stored to represent the change in the pointer information caused by the operand. In the case of bytes which represent arguments, a "no-change" delta code is stored. Then, in the routine illustrated in FIG. 5, step 514 is modified to simply increment the program count for each byte between the saved program count and the present program count.

The methods of the invention may likewise be achieved in either all software implementations, using the appropriate processor instructions, or in hybrid implementations which utilize a combination of hardware, firmware and software logic to achieve the same results. Further, aspects such as the size of memory, number of bits utilized to represent datum or a signal, data word size, the number of clock cycles necessary to execute an instruction, and the specific configuration of logic and/or instructions utilized to achieve a particular function, as well as other modifications to the inventive concept are intended to be covered by the appended claims.

What is claimed is:

1. A method for use in a computer system having a memory and a program stored therein, the program including a sequence of bytecodes, the method encoding live pointer locations in a program data stack frame used by the program during execution, the method comprising the steps of:

A. computing live pointer locations in the program data stack frame at each bytecode boundary in the sequence of bytecodes;

B. storing computed live pointer locations at selected bytecode boundaries; and

C. storing changes to the stored live pointer locations caused by each bytecode located in the bytecode sequence between the selected bytecode boundaries for which live pointer locations were stored in step B.

2. The method of claim 1 wherein step C comprises the steps of:

C.1 encoding the changes to the stored live pointer locations caused by each bytecode by means of a compressive encoding method; and C.2 storing the encoded changes.

3. The method of claim 2 wherein step C.1 comprises the step of:

C.1.A encoding the changes to the stored live pointer locations caused by each bytecode by means of a Huffman encoding method.

4. The method of claim 1 wherein step C comprises the step of:

C.2 storing a change to the stored live pointer locations, which change is a delta change caused by each bytecode.

5. The method of claim 1 wherein step A comprises the step of:

A.1 computing live pointer locations in a program data stack frame for each bytecode boundary during program compilation.

6. The method of claim 1 wherein step A comprises the step of:

A.2 computing live pointer locations in a program data stack frame for each bytecode boundary during program loading.

7. The method of claim 1 wherein step A comprises the step of:

A.3 computing, at each bytecode boundary, a bit vector having a bit corresponding to each item in the program data stack frame.

8. The method of claim 1 wherein step B comprises the step of:

B.1 storing information designating all live pointer locations in the program data stack frame corresponding to bytecode boundaries located at predetermined fixed intervals in the sequence of bytecodes.

9. The method of claim 8 wherein step B.1 comprises the step of:

B.1.A storing information designating all live pointer locations in the program data stack frame corresponding to every sixteenth bytecode boundary.

10. The method of claim 1 further comprising decoding the information stored in steps B and C to identify live pointer locations in a program data stack frame at a selected point in the bytecode sequence and comprising the steps of:

D. examining the information stored in step B to retrieve information designating all live pointer locations in the program data stack frame corresponding to a bytecode boundary preceding the selected point in the bytecode sequence; and E. examining the information stored in step C to modify the information retrieved in step D for each bytecode between the preceding bytecode boundary and the selected point.

11. The method of claim 10 wherein step D comprises the step of:

D.1 examining the information stored in step B to retrieve information corresponding to a bytecode boundary immediately preceding the selected point in the bytecode sequence.

12. The method of claim 10 wherein the change stored in step C is encoded and step E comprises the step of:

E.1 retrieving information stored in step C for each bytecode;

E.2 decoding information retrieved in step E.1 to determine a change created by each bytecode; and E.3 applying the change to the information retrieved in step D.

13. The method of claim 12 wherein step E.2 comprises the step of:

E.2.A decoding information retrieved in step E.1 with a Huffman decoding tree.

14. Apparatus for use in a computer system having a memory and a program stored therein, the program including a sequence of bytecodes, the apparatus encoding live pointer locations in a program data stack frame used by the program during execution, the apparatus comprising:

a stack analyzer which computes live pointer locations in the program data stack frame at each bytecode boundary in the sequence of bytecodes;

a first storage element configured to store computed live pointer locations at selected bytecode boundaries;

a bytecode analyzer which determines changes to the stored live pointer locations caused by each bytecode located in the bytecode sequence between the selected bytecode boundaries; and a second storage element configured to store the changes determined by the bytecode analyzer.

15. The apparatus of claim 14 wherein the bytecode analyzer comprises:

an encoder which encodes the changes to the stored live pointer locations caused by each bytecode by means of a compressive encoding method.

16. The apparatus of claim 15 wherein the encoder comprises a Huffman encoder.

17. The apparatus of claim 14 wherein the bytecode analyzer determines changes to live pointer locations caused by each bytecode which changes are delta changes.

18. The apparatus of claim 14 wherein the stack analyzer operates during program compilation.

19. The apparatus of claim 14 wherein the stack analyzer operates during program loading.

20. The apparatus of claim 14 wherein the stack analyzer computes, at each bytecode boundary, a bit vector having a bit corresponding to each item in the program data stack frame.

21. The apparatus of claim 14 further comprising a decoder which decodes stored information to identify live pointer locations in the program data stack frame at a selected point in the bytecode sequence and comprises:

a first retrieval element which retrieves information designating all live pointer locations in the program data stack frame corresponding to a bytecode boundary preceding the selected point in the bytecode sequence; and a second retrieval element which modifies the information retrieved by the first retrieval element for each bytecode between the preceding bytecode boundary and the selected point.

22. The apparatus of claim 21 wherein the first retrieval element retrieves information corresponding to a bytecode boundary immediately preceding the selected point in the bytecode sequence.

23. The apparatus of claim 21 wherein the change stored by the bytecode analyzer is encoded and the second retrieval element retrieves information stored for each bytecode, decodes the retrieved information to determine a change created by each bytecode; and applies the change to the information retrieved by the first retrieval element.

24. The apparatus of claim 23 wherein the second retrieval element decodes information stored for each bytecode with a Huffman decoding tree.

25. A computer system for encoding live pointer locations in a program data stack frame and comprising:

a processor;

a memory coupled to the processor;

a sequence of bytecodes stored in the memory forming a program;

a program data stack frame in the memory;

a stack analyzer which computes live pointer locations in the program data stack frame at each bytecode boundary in the sequence of bytecodes;

a first storage element configured to store computed live pointer locations at selected bytecode boundaries;

a bytecode analyzer which determines changes to the stored live pointer locations caused by each bytecode located in the bytecode sequence between the selected bytecode boundaries; and a second storage element configured to store the changes determined by the bytecode analyzer.

26. The computer system of claim 25 wherein the bytecode analyzer comprises:

an encoder which encodes the change to live pointer locations caused by each bytecode by means of a compressive encoding method.

27. The computer system of claim 26 wherein the encoder comprises a Huffman encoder.

28. The computer system of claim 25 wherein the bytecode analyzer determines a change to live pointer locations caused by each bytecode which change is a delta change.

29. The computer system of claim 25 further comprising a decoder which decodes stored information to identify live pointer locations in a program data stack frame at a selected point in the bytecode sequence and comprises:

a first retrieval element which retrieves information designating all live pointer locations in the program data stack frame corresponding to a bytecode boundary preceding the selected point in the bytecode sequence; and a second retrieval element which modifies the information retrieved by the first retrieval element for each bytecode between the preceding bytecode boundary and the selected point.

30. A computer program product for use in a computer system having a memory, and controlled by a sequence of bytecodes stored in the memory, the computer program product encoding live pointer locations in a program data stack frame and comprising a computer usable medium having computer readable program code thereon including:

program code for computing live pointer locations in the program data stack frame at each bytecode boundary in the sequence of bytecodes;

program code for storing computed live pointer locations at selected bytecode boundaries; and program code for storing changes to the stored live pointer locations caused by each bytecode located in the bytecode sequence between the selected bytecode boundaries.

31. The computer program product of claim 30 wherein the program code for storing changes to live pointer locations comprises:

program code for encoding changes to live pointer locations caused by each bytecode by means of a compressive encoding method; and program code for storing the encoded changes.

32. The computer program product of claim 31 wherein the program code for encoding the changes to live pointer locations comprises:

program code for encoding the change to live pointer locations caused by each bytecode by means of a Huffman encoding method.

33. The computer program product of claim 30 wherein the program code for encoding the changes to live pointer locations comprises:

program code for storing a change to live pointer locations caused by each bytecode which change is a delta change.

34. The computer program product of claim 30 further comprising program code for decoding the stored information identifying live pointer locations in the program data stack frame at a selected point in the bytecode sequence and comprising:

program code for retrieving information designating all live pointer locations in the program data stack frame corresponding to a bytecode boundary preceding the selected point in the bytecode sequence; and program code for modifying the information retrieved for each bytecode between the preceding bytecode boundary and the selected point.

35. A method for use in a computer system having a memory and a program stored therein, the program including a sequence of bytecodes and using a program data stack frame during execution, the method decoding previously encoded information stored in the memory to determine live pointer locations in the program data stack frame at a selected point in the bytecode sequence, the method comprising the steps of:

A. examining the stored previously encoded information to retrieve information designating all live pointer locations in the program data stack frame corresponding to a bytecode boundary preceding the selected point in the bytecode sequence; and B. examining the stored previously encoded information to modify the information retrieved in step A for each bytecode between the preceding bytecode boundary and the selected point in order to determine live pointer locations in the program data stack frame at the selected point.

36. The method of claim 35 wherein step A comprises the step of:

A.1 examining the stored previously encoded information to retrieve information corresponding to a bytecode boundary immediately preceding the selected point in the bytecode sequence.

37. The method of claim 35 wherein the stored previously encoded information contains encoded changes caused by each bytecode between the preceding bytecode boundary and the selected point and step B comprises the step of:

B.1 retrieving information for each bytecode;

B.2 decoding information retrieved in step B.1 to determine a change created by each bytecode; and B.3 applying the change to the information retrieved in step A.

38. The method of claim 37 wherein step B.2 comprises the step of:

B.2.A decoding information retrieved in step B.1 with a Huffman decoding tree.

39. A garbage collection method for use in a computer system having a memory and a program stored therein, the program including a sequence of bytecodes and using a program data stack frame during execution, the method stopping the program at a selected point in the bytecode sequence and reclaiming unused memory locations, the method comprising the steps of:

A. examining previously encoded information stored in the memory to retrieve information designating all live pointer locations in the program data stack frame corresponding to a bytecode boundary preceding the selected point in the bytecode sequence;

B. examining the stored previously encoded information to modify the information retrieved in step A for each bytecode between the preceding bytecode boundary and the selected point in order to determine live pointer locations in the program data stack frame at the selected point; and C. using the live pointer locations as determined in step B to determine unused memory locations.

40. The method of claim 39 wherein step A comprises the step of:

A.1 examining the stored previously encoded information to retrieve information corresponding to a bytecode boundary preceding the selected point in the bytecode sequence.

41. The method of claim 39 wherein the stored previously encoded information contains encoded changes caused by each bytecode between the preceding bytecode boundary and the selected point and step B comprises the step of:

B.1 retrieving information for each bytecode;

B.2 decoding information retrieved in step B.1 to determine a change created by each bytecode; and B.3 applying the change to the information retrieved in step A.

42. The method of claim 41 wherein step B.2 comprises the step of:

B.2.A decoding information retrieved in step B.1 with a Huffman decoding tree.

* * * * *